US012188985B2

(12) United States Patent
Kurtz et al.

(10) Patent No.: US 12,188,985 B2
(45) Date of Patent: Jan. 7, 2025

(54) BATTERY MANAGEMENT SYSTEM FOR AN ELECTRIC AIR VEHICLE

(71) Applicant: Lilium eAircraft GmbH, Wessling (DE)

(72) Inventors: Johannes Kurtz, Grosskarolinenfeld (DE); Bartlomiej Bronski, Innings at Lake Ammer (DE); Pedro Manuel De La Camara Cruz, Mindelheim (DE); Julian Carl, Munich (DE)

(73) Assignee: Lilium eAircraft GmbH, Wessling (DE)

( * ) Notice: Subject to any disclaimer, the term of this patent is extended or adjusted under 35 U.S.C. 154(b) by 341 days.

(21) Appl. No.: 17/651,734

(22) Filed: Feb. 18, 2022

(65) Prior Publication Data
US 2022/0299569 A1    Sep. 22, 2022

Related U.S. Application Data

(63) Continuation of application No. PCT/EP2022/051970, filed on Jan. 28, 2022.

(30) Foreign Application Priority Data

Feb. 19, 2021  (EP) .................................. 211580956

(51) Int. Cl.
*G01R 31/367*    (2019.01)
*B60L 58/16*    (2019.01)
(Continued)

(52) U.S. Cl.
CPC ............ *G01R 31/367* (2019.01); *B64C 29/00* (2013.01); *B64D 43/00* (2013.01);
(Continued)

(58) Field of Classification Search
None
See application file for complete search history.

(56) References Cited

U.S. PATENT DOCUMENTS

| 8,890,480 B2 | 11/2014 | Vian et al. |
| 9,658,291 B1 | 5/2017 | Wang et al. |
| (Continued) | | |

FOREIGN PATENT DOCUMENTS

| CN | 105874643 A | * 8/2016 | .............. B60L 58/10 |
| CN | 105874643 B | 5/2019 | |
| (Continued) | | | |

OTHER PUBLICATIONS

CN105874643 translation (Year: 2016).*
(Continued)

*Primary Examiner* — Lina Cordero
(74) *Attorney, Agent, or Firm* — TraskBritt

(57) ABSTRACT

The present disclosure relates to a battery management system for an electric air vehicle such as an eVTOL aircraft for observing a battery system state and a battery health state of an energy storage system of the air vehicle. Based on an observation result, a state prediction, in particular, a prediction of the remaining accessible energy, is carried out during a flight. In particular, the observation and prediction is performed by two independent and dissimilar lanes of the battery management system. A first lane predicts the battery state according to a pre-defined flight profile representing a worst-case scenario. A second lane predicts the battery state according to a planned flight profile so as to determine a range of the flight. Hence, it can be confirmed during the flight that the intended destination can be safely reached with the remaining accessible energy.

21 Claims, 4 Drawing Sheets

(51) Int. Cl.
*B64C 29/00* (2006.01)
*B64D 43/00* (2006.01)
*G01R 31/3842* (2019.01)
*G01R 31/392* (2019.01)
*H02J 7/00* (2006.01)

(52) U.S. Cl.
CPC ....... *G01R 31/3842* (2019.01); *G01R 31/392* (2019.01); *H02J 7/0013* (2013.01); *H02J 7/0048* (2020.01); *H02J 7/005* (2020.01); *B60L 58/16* (2019.02); *B60L 2200/10* (2013.01); *H02J 2310/44* (2020.01)

(56) References Cited

U.S. PATENT DOCUMENTS

| | | | |
|---|---|---|---|
| 2010/0121587 A1 | 5/2010 | Vian et al. | |
| 2015/0100198 A1* | 4/2015 | Vian | H01M 10/48 701/31.9 |
| 2017/0225584 A1* | 8/2017 | Jin | G01R 31/367 |
| 2018/0267110 A1* | 9/2018 | Kondo | G01R 31/392 |
| 2020/0277080 A1* | 9/2020 | Wiegman | B60L 50/60 |
| 2021/0286018 A1* | 9/2021 | Jeong | H02J 7/0013 |

FOREIGN PATENT DOCUMENTS

| | | | | |
|---|---|---|---|---|
| EP | 3731535 A1 * | 10/2020 | ........... | G01R 31/382 |
| KR | 10-2013-0126128 A | 11/2013 | | |

OTHER PUBLICATIONS

European Extended Search Report from European Application No. 21158095.6, dated Sep. 29, 2021, 7 pages.
International Search Report for International Application No. PCT/EP2022/051970, mailed Jul. 21, 2022, 4 pages.
International Written Opinion for International Application No. PCT/EP2022/051970, mailed Jul. 21, 2022, 7 pages.
European Search Report and Opinion for U.S. Appl. No. 21/158,095 dated Sep. 21, 2021, 5 pages.

* cited by examiner

BATTERY MANAGEMENT SYSTEM FOR AN ELECTRIC AIR VEHICLE

CROSS-REFERENCE TO RELATED APPLICATIONS

Pursuant to 35 U.S.C. § 119(a), this application claims the benefit of the filing date of European Patent Application Serial No. 21158095.6, filed Feb. 19, 2021, for "Battery Management System for an Electric Air Vehicle," and International Patent Application PCT/EP2022/051970, filed Jan. 28, 2022, the disclosure of each of which is hereby incorporated herein in its entirety by this reference.

TECHNICAL FIELD

The present disclosure relates to battery management systems (energy management systems). More specifically, the present disclosure relates to a distributed battery management architecture for battery state and health monitoring and battery state prediction of an energy storage system of an electric air vehicle.

BACKGROUND

In recent years, electricity has gained increasing importance as a form of energy for driving air vehicles. This includes, in particular, electric aircrafts with vertical take-off and landing functionality (eVTOL).

A crucial component for electric (i.e., electrically driven/electrically propelled) aircrafts, including eVTOL, is an appropriate energy storage system (ESS). The energy storage system may be realized in the form of a battery system of chargeable batteries, which may be structured into a plurality of individual battery cells. Individual battery cells may be combined together to form one or more battery modules of an aircraft battery system used as an energy storage system. An example of a battery type suitable for being used in the framework of the present disclosure are Lithium (Li)-ion batteries, without the present disclosure being limited to this.

Generally speaking, the function of the energy storage system is to provide an electrically driven aircraft with sufficient accessible energy for safe flight and landing. As this is generally the case with respect to air traffic, the highest safety standards are applicable to the components of air vehicles, including the ESS. In order to ensure safe operation and, in particular, safe landing with the sufficient amount of remaining accessible energy, parameters of the ESS defining critical states that limit the amount of accessible energy must be monitored and communicated to an operator.

Such parameters include but are not limited to, for instance, a cell temperature or a state-of-charge (SOC) of individual battery cells of the ESS. As some of such parameters are not directly measurable quantities but relate to internal states, the design of the ESS must foresee appropriate means for a respective state observation. The state observation is based on the measurement of physical data, including but not being limited to terminal cell voltages, surface temperatures of cells or currents. Further, possibly residual errors in state determination have to be taken into account as potentially limiting the accessible energy and thus the range of an air vehicle. Such residual errors generally occur in view of the limited accuracy of any models used for describing the ESS and its states. Further, the accessible energy of a battery is highly dependent on the flight profile. Hence, the energy management system also has to perform a state prediction with regard to the planned flight profile until the electrically propelled aircraft reaches safe landing.

It is, therefore, a crucial task during the design phase of the ESS that the maximum error of the state prediction for a planned flight is known and can be taken into account each time, during planning of an individual flight as well as during the flight itself, when the current status of the ESS, in particular the remaining accessible energy defining the remaining flight range, is to be determined. The planned profile defines the consumed power over time and shall be in strict accordance with the operational requirements of the aircraft. The maximum error metric in state prediction for the complete lifetime of the ESS shall be considered as the safety margin. This assures that the residual errors in state observation and state prediction do not particularly influence the utilization of the ESS within its known physical limits.

Therefore, a state prediction that is based on state monitoring can assure that a planned profile does not violate any safety boundary until a safe landing has been reached. This allows an operator to confirm the usable energy and range for a given mission at any time during a flight according to a particular profile and before landing.

A schematic representation of the tasks to be performed by a battery management system (energy management system) for state observation and state prediction during a flight according to a particular flight profile will be described below with reference to FIG. 1.

In the upper portion of FIG. 1, a diagram indicating the required power during the flight according to the profile over time is shown. As can be seen therefrom, the required power is particularly high immediately after take-off and in the final phase of the flight, before landing. In the example shown in the drawing, it is assumed that the current time, indicated by the symbol of an aircraft in a flight state, is in-between the take off and the beginning of the landing phase. Hence, with respect to the current time, the flight phase before lies in the past and the forthcoming flight phase shall be conducted in accordance with the planned flight profile. As further indicated, by means of a hatched box at the end of the flight, a certain amount of energy should remain available at the destination, for reasons of safety. Hence, the endpoint on the timescale is defined by the condition that the predetermined remaining energy is still accessible (End Point Condition). In other words, the indicated point later in time (Physical Limit) that might still be reachable on the basis of the remaining accessible energy should never be considered as accessible in operation, in order to take into account uncertainties in state prediction.

During the flight, the state of the ESS is permanently monitored (State Observation). This includes but is not limited to physical measurements, model-based estimation, estimation with the help of neural networks as well as model-based correction/calibration of measurement data. The state observation specifically observes a plurality of states of function (State of Function SOF). These may include but are not limited to, for instance, a cell State of Charge (SOC), a cell core temperature, a cell current collector temperature, a cell current, and an HV (high-voltage) cable temperature. For each state of the ESS there may occur a degradation over a larger timescale during the life-cycle and usage. This degradation causes the respective state to limit the ESS's capability to provide energy for safe flight and landing earlier. Thus the observation of the respective state has to be accompanied by health parameters. Health parameters reflect changes on a larger timescale during the life-cycle of the battery. In particular, battery health parameters of a battery cell may include, without being limited to these, at least one of cell capacity and cell impedance.

On the basis of the state observation and health parameter observation during the flight phase before the current time (Past), a state prediction is performed for future points in time. In particular, the state prediction may include using look-up tables, model-based prediction and prediction using neural networks, without being limited to these. This enables a prediction of the state, for example, the SOF listed above and indicated in the lower portion of the drawing, until the end of the planned flight profile, with taking into account any safety margin and residual errors determined in advance. In particular, as soon as the remaining accessible energy at the time of landing according to the planned flight profile falls below the predefined Remaining Energy at Destination, an alert must be issued to the operator immediately so as to ensure safe landing at the nearest available airfield.

An erroneous determination of accessible energy leads to a catastrophic failure condition. This classification is derived from the assumption that the erroneous display of accessible energy would guide a pilot to conduct flight maneuvers, especially flying distances, which the battery cannot sustain with sufficient energy for continued safe flight and landing.

On the other hand, a total or partial loss of the determination of accessible energy is not classified as catastrophic, because a pilot when becoming aware of this condition, should anyway assume that the remaining accessible energy is insufficient for reaching the planned destination and safely land at the next available airfield, to be on the safe side.

BRIEF SUMMARY

The present disclosure provides a battery management system capable of predicting the state of an ESS with sufficient redundancy so as to comply with the high safety requirements applicable in air traffic.

This is achieved by the features of claim 1.

According to an aspect of the present disclosure, a battery management system for an electric air vehicle is provided. The battery management system is adapted for battery cell state monitoring and health parameter monitoring and battery state prediction of a battery system forming an energy storage system of the air vehicle. The battery management system comprises two independent and dissimilar lanes for battery cell state and health parameter determination and battery state prediction. Each of the lanes includes a battery cell measurement equipment for obtaining battery cell measurement data of each of a plurality of battery cells constituting the battery system. Each of the lanes further includes battery state and battery health parameter determination equipment adapted to calculate a battery cell state and at least one health parameter based on the battery cell measurement data obtained by the battery cell measurement equipment of the respective lane by using dissimilar algorithms, respectively. The battery management system further comprises first lane battery state prediction equipment adapted to perform a battery state prediction predicting a battery cell state evolution with regard to a pre-defined flight profile, which is pre-stored locally and fixed for the air vehicle. The battery management system further comprises second lane battery state prediction equipment being adapted to perform a battery state prediction predicting a battery cell state evolution with regard to a planned flight profile of a currently planned flight.

It is the particular approach of the present disclosure to provide an energy management system (battery management system) that performs the necessary measurements and calculations for monitoring and predicting the battery state of the ESS redundantly in two independent and dissimilar lanes. Each of the lanes includes a plurality of battery cell measurement means (battery cell measurement equipment), battery state and battery health parameter determination equipment and battery state prediction equipment. The fact that the two lanes are independent means that each lane is capable of performing a full state observation and prediction, including determining any desired state parameter of the cells of the ESS at any time, without the need to rely upon any determination made by the other lane, which is thus redundant. The fact that the two lanes are dissimilar means that the algorithm for determining state parameters used by the two lanes are different with respect to each other. This may include different kinds of measurements to be performed by the battery cell measurement equipment of the respective lanes as well. Specifically, a first lane of the two lanes performs a battery state prediction according to a pre-defined (fixed) flight profile representing a worst-case scenario regarding a combination of component failures and environmental conditions with a maximum distance to a closest landing point. The second lane performs a battery state prediction according to a planned flight profile of a current flight.

The overall status of a battery, in addition to particular variables reflecting a current status (battery cell state) such as charging and temperature status further depends on the status and evolution of health parameters, as discussed above.

In embodiments, the battery cell state to be monitored includes at least one of a cell state of charge, a cell core temperature or a cell tab temperature. Each of these parameters generally influences the accessible amount of energy of the battery system.

In embodiments, the battery cell measurement data obtained by the battery cell measurement equipment includes at least one of cell terminal voltage, current and surface temperature. These parameters are accessible through measurement and may form a basis for calculating parameters indicating the battery state according to well-known algorithms that take into account the particular hardware structure of the battery system and cells.

According to embodiments, in each of the lanes, the battery cell measurement equipment and battery state and battery health parameter determination equipment is arranged in a master-slave architecture, wherein a battery measurement master unit aggregates battery measurement data obtained by a plurality of battery measurement slave units and includes the battery state and battery health parameter determination equipment of the respective lane. This allows for a simple communication structure.

Also, in embodiments, an initial safety check is performed on the level of battery cell measurements, in order to detect and invalidate erroneous measurement data. Accordingly, besides the actual measurement devices (circuitry such as sensors, probes), the battery measurement equipment may incorporate some circuitry for performing logical operations as well. This can be particularly easily achieved within a master-slave architecture as well, wherein the master unit is responsible for detection and invalidation of erroneous data.

According to embodiments, the battery cell measurements performed by the battery cell measurement equipment of each of the independent lanes are dissimilar to each other. Accordingly, the measurements of physically accessible parameters themselves contribute to the dissimilarity of the lanes. This avoids a situation, wherein a system failure occurs due to any principal flaw in a measurement algorithm or principle. Examples for dissimilar measurement schemes are a scheme using PTC (Positive Temperature Coefficient) and a scheme using NTC (Negative Temperature Coefficient) elements for temperature measurements, a scheme using a shunt and a scheme using a Hall sensor for current measurements or schemes using two different ADC (analog-to-digital converter) suppliers for voltage measurement.

According to embodiments, each lane further comprises an indication and recording system adapted to receive battery state data predicted by the respective lane. The indication and recording system is responsible for informing an operator about the evaluation result so that necessary consequences can be drawn and decisions made. More specifically, in accordance with embodiments, the indication and recording system of the first lane is configured to indicate an alert to the operator (pilot) when the remaining accessible energy, according to the predicted battery state, is insufficient to reach an (alternate) landing point in case of a worst-case component failure and under worst-case environmental conditions. In that case, the operator may be advised to interrupt flying along the predetermined flight profile and start the procedure for safe landing at the nearest available airfield immediately.

Also, according to embodiments, the indication and recording system of the second lane is adapted to indicate the battery state evolution against the planned flight profile to the pilot.

In accordance with embodiments, a remaining range of flight according to the planned flight profile is determined by the flight management system on the basis of the predicted battery state.

Further, according to embodiments the indication and recording systems are configured to indicate the battery state evolution to the pilot graphically.

In accordance with embodiments, a battery cell with a minimum value (corresponding to the lowest amount of accessible energy) of a battery cell state in conjunction with the respective health parameters is taken as a basis for an overall battery state and health assessment. In other words, the overall assessment of a battery and the amount of accessible energy is made on the basis of the "weakest" one of the cells.

In accordance with embodiments, the first lane uses dedicated hardware equipment for the battery state prediction. More specifically, in embodiments, the first lane battery state prediction equipment is integrated in a unit of the first lane further comprising the battery state and battery health parameter determination equipment of the first lane. Still more specifically, the battery state prediction equipment of the first lane may be integrated in a battery management master unit of the first lane of a battery management system (BMS) having a master-slave architecture.

Preferably, the second lane uses the capacity of a flight management system outside the battery system as the battery state prediction equipment. More specifically, in embodiments, in the second lane of the two lanes, the battery state prediction equipment is implemented by means of a flight management system, which is a partition of a vehicle management computer provided outside of and separately from the battery system forming the energy storage system. The flight management system is thus additionally used for battery management tasks in the second lane.

Such embodiments have the additional advantage that the planned flight profile is anyway available in the flight management system (vehicle management computer (system)), which performs inter alia the flight planning tasks.

Moreover, in that case, the battery state prediction equipment of Lane 2 is completely independent from that of Lane 1.

The present disclosure is, however, not limited to such embodiments. Within the framework of the present disclosure, it is alternatively possible to implement the second lane battery state prediction equipment included (integrated) in the second lane battery state and health parameter determination equipment (BMS master). In that case, the planned flight profile must be made available/forwarded to the battery state prediction equipment by the flight management system.

Still alternatively, it is possible to implement the battery state prediction equipment of both lanes by means of flight management system components. If both lanes use flight management system components to implement the battery state prediction equipment, it is required to use different and independent hardware for the prediction of both lanes such as different vehicle management computers (VMC).

Depending on the implementation of the first lane battery state equipment, it is desirable to store the pre-defined (fixed) flight profile of the air vehicle so as to be accessible by the unit performing the prediction. For instance, the pre-defined flight profile can be stored in a unit comprising the first lane battery state and/or health parameter determination equipment such as a first lane battery master unit. Alternatively, the pre-defined flight profile can be stored at the flight management system component utilized for the battery state prediction.

In embodiments of the present disclosure, wherein a flight management system implemented on the basis of vehicle management computers existing in modern air vehicles (but separately from an energy storage system) for various purposes is additionally used for battery state prediction in at least one of the lanes (second lane), a reduction of cost, certification risk and weight can be achieved as compared to a battery management system architecture, wherein full computation processing equipment in accordance with the highest assurance levels has to be additionally included in the battery system (ESS) itself.

In embodiments, the air vehicle is an electric vertical take-off and landing aircraft, eVTOL.

In embodiments, the battery cell state determination by the two independent and dissimilar lanes uses different algorithms including two (one for each lane) out of the following: a model-based state-of-charge, SOC, estimation algorithm, an algorithm using Electrochemical Impedance Spectroscopy, EIS, and a Coulomb Counting algorithm. In a lane using the model-based SOC estimation algorithm, the battery cell measurement equipment is adapted to measure the current, voltage and temperature of each of the plurality of battery cells. In a lane using EIS, the battery cell measurement equipment is adapted to individually excite the battery cells with sinusoidal current of variable frequency and to measure the voltage response of each cell, and the vehicle management computer is adapted to calculate a complex system impedance based on a ratio between an input excitation current and voltage response. In a lane using the Coulomb Counting algorithm, the battery cell measurement equipment is adapted to determine the charging current for each individual cell of the plurality of battery cells during ground operation and to determine the overall load currents of each individual cell and the vehicle management computer is adapted to calculate a state-of-charge based on the determined charging current and overall load currents of each individual cell.

Further, the at least one health parameter of the battery system is calculated by the two independent and dissimilar lanes using two (one for each lane) out of the following algorithms: a model-based cell parameter estimation algorithm, an algorithm using Electrochemical Impedance Spectroscopy, EIS, a dedicated maintenance procedure, a dedicated charging procedure and an empirical ageing model. In a lane using the model-based cell parameter estimation algorithm, the dedicated maintenance procedure, the dedicated charging procedure or the empirical ageing model, the battery cell measurement equipment is adapted to measure the current voltage and temperature of each of the plurality of battery cells. In a lane using EIS, the battery cell measurement equipment is adapted to individually excite the battery cells with sinusoidal current of variable frequency and to measure the voltage response of each cell and the vehicle management computer is adapted to calculate a complex system impedance based on a ratio between an input excitation current and a voltage response.

In accordance with a further particular aspect of the present disclosure, an air vehicle comprising a battery management system according to the above aspect or each of the embodiments is provided.

Further features and advantages of the present disclosure are set forth in dependent claims.

BRIEF DESCRIPTION OF THE DRAWINGS

Additional features and advantages of the present disclosure will become apparent in the following and more particular description as illustrated in the accompanying drawings, wherein.

DETAILED DESCRIPTION

Figure 1:
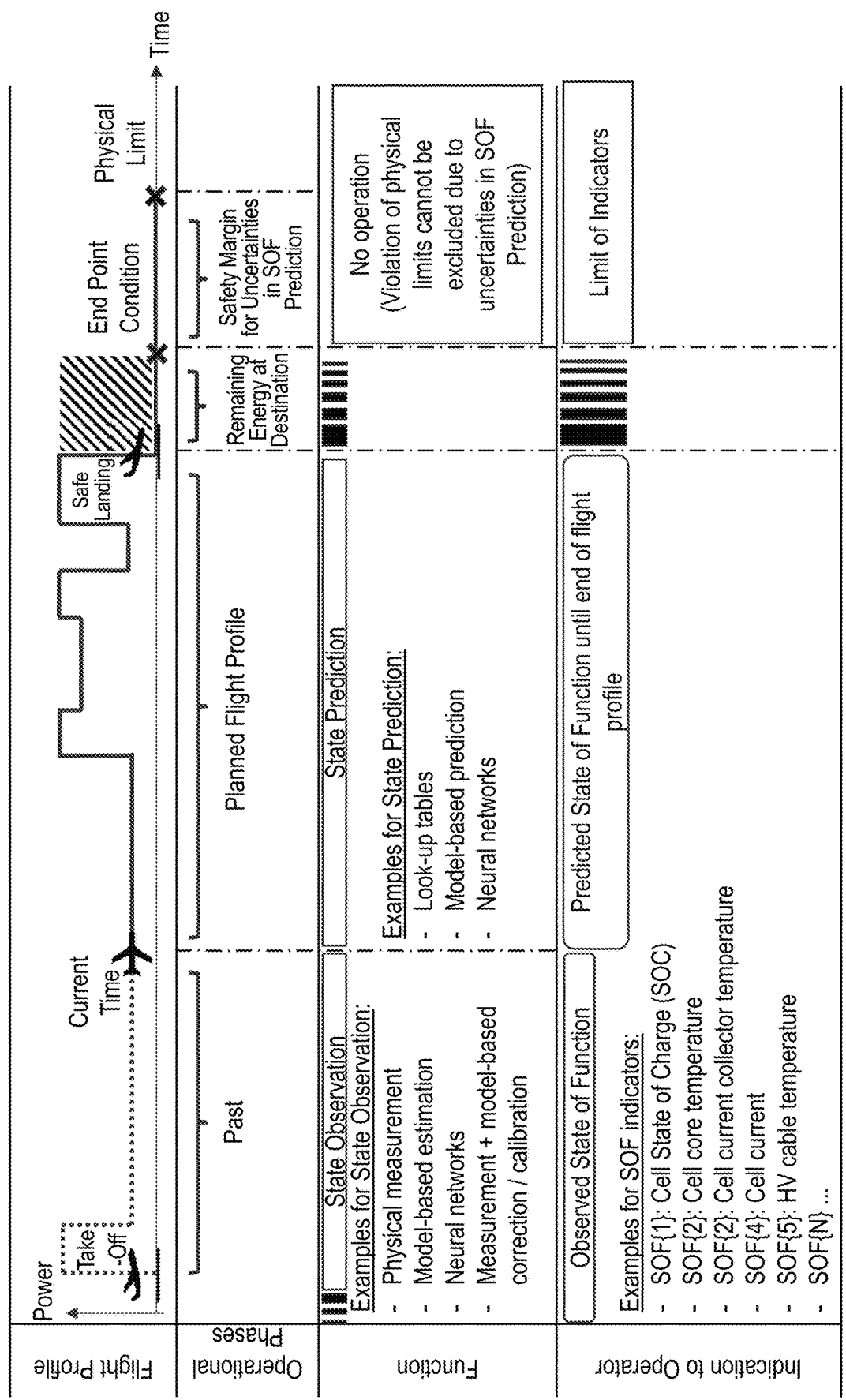
FIG. 1 is an overview diagram illustrating state observation and state prediction for an energy storage system of an air vehicle flying in accordance with a predetermined flight profile.

The present disclosure relates to a battery management system having a distributed architecture for electrically driven air vehicles, in particular, eVTOL, for determining and observing battery cell state and health parameters. The observation result is used to determine an amount of accessible energy in battery systems serving as an energy storage system (ESS) for the air vehicle so as to determine (predict) the flight range according to a predetermined flight profile, in particular, at any time during the flight.

For this purpose, the present disclosure utilizes an innovative battery management system architecture that provides two redundant and dissimilar lanes of battery cell state and health parameter observation. The battery management system is comprised of two independent and dissimilar lanes (Lane 1—first lane and Lane 2—second lane) to obtain cell measurement data (for example: cell voltage, temperature and current).

Furthermore, both lanes provide an independent and dissimilar observation of battery states, for example, cell state of charge, cell temperature and observation of battery health parameters, for example, cell capacity and cell impedance.

Generally speaking, in the present disclosure, (battery cell) states are defined by system variables that quickly evolve over time, i.e., in the order of seconds depending on the system input. Examples for cell states are the cell state of charge, cell core temperature or cell tab temperature. On the other hand, health parameters are system variables that slowly evolve over time, i.e., in the order of days, depending on the system input. Examples for cell health parameters are the cell capacity or the cell impedance.

Battery cell measurements (in particular, for example, cell terminal voltage, current and surface temperature measurements) for battery cell state and health parameter observation are provided by two redundant and dissimilar lanes. In embodiments, each of these lanes may be implemented by means of a master-slave architecture, wherein each lane comprises at least one BMS (Battery Management System) master and plural BMS slaves. The battery cell measurement equipment for obtaining cell measurement data is then realized by the BMS slaves, as will be detailed below.

On the basis of the observations, both lanes further provide an independent and dissimilar prediction of battery states. This is required to provide a certifiable solution to the catastrophic failure condition of an erroneous flight range estimation that excludes a single point of failure. Both lanes individually provide sufficient information to the pilot whether the flight can be continued or whether an immediate diversion to an alternate landing point is needed.

For Lane 1, the battery states and health parameters are used to predict the cell state evolution with regard to a pre-defined flight profile, which is preferably stored locally on the Battery Management System. This flight profile is a worst-case combination of component failures and worst-case environmental weather conditions and aircraft performance and with the maximum distance to the closest landing point. This is accounting for likely component failures.

For Lane 1, the pre-defined flight profile used as a basis for prediction by the first lane is specified to cover all power demands of any valid flight profile without component failures. In other words, if the pre-defined flight profile can be performed by the battery then all planned flight profiles with the same duration can be performed. Therefore, an erroneous prediction by Lane 1 is not a single point of failure since it would lead to a catastrophic error only in conjunction with worst-case component failure. Only an erroneous prediction by Lane 1 in combination with a worst-case component failure is catastrophic.

For Lane 1, the result of the battery state prediction is provided to the pilot via the indication and recording system as an alert. In case the battery cannot provide accessible energy for this pre-defined flight profile, the pilot shall land at the closest landing point (vertiport) (low-energy alert).

For Lane 2, in preferred embodiments the battery state and health parameter are provided to the Flight Management System (FMS). There, the planned flight profile is derived from the actual flight plan to the destination and contains the expected environmental weather conditions, aircraft performance and no component failures. The Flight Management System is realized on the basis of a Vehicle Management Computer (VMC) as known in the pertinent field of aircraft control.

A vehicle management computer is, as such, known in the art as a piece of aircraft equipment that is used for various functions, such as supervision of aircraft states, data communication, control of electrical power distribution, and control of thermal management. For reasons of reliability and safety in air traffic, it is common to provide two redundant VMCs.

Alternatively, the planned flight profile derived at the FMS may be forwarded to different battery state prediction equipment of the second lane such as a BMS master unit.

For Lane 2, the result of the battery state prediction is provided graphically to the pilot via the indication and recording system to enable detailed flight planning. This detailed flight planning comprises but is not limited to the determination of the current deviation from the flight plan and remaining energy at the destination.

It is further noted that as indicated above, in the framework of the present disclosure all measurements and observations are made on the level of individual battery cells. For an evaluation, such as for the determination of an accessible energy or range prediction, as well as a potential failure prediction, in view of the high safety requirements in air traffic, always the cell having lowest energy is taken as the basis.

Figure 2:
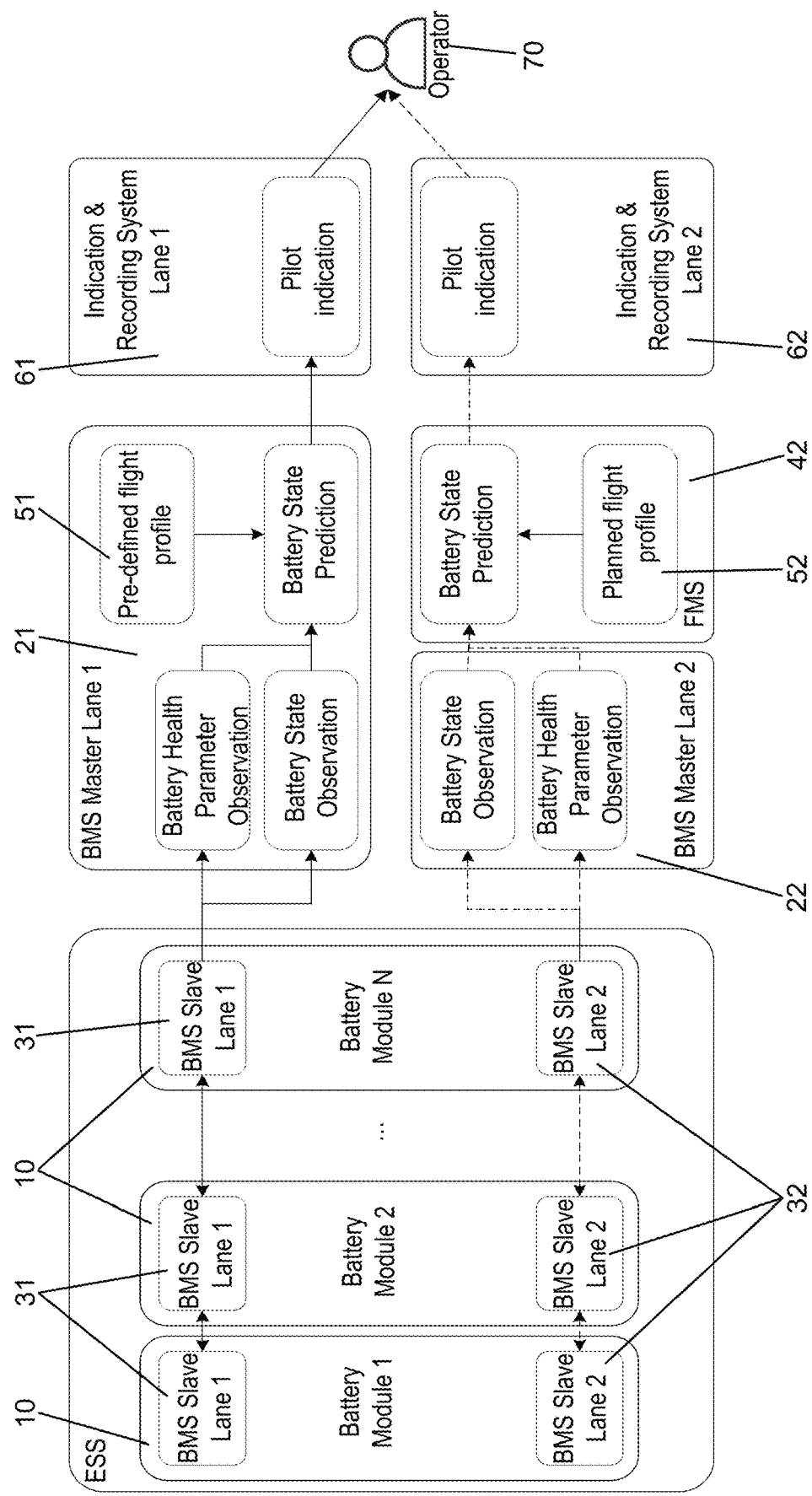
FIG. 2 is a diagram showing an exemplary structure of a battery management system in accordance with embodiments of the present disclosure.

The principle outlined above is illustrated in more detail in the drawing of FIG. 2. It is emphasized that the details shown in this drawing are illustrating embodiments of the disclosure by way of example only and the present disclosure as defined by the appended claims is not limited to the illustrated embodiments.

The left-hand side of the drawing shows an energy storage system (ESS). The ESS comprises the battery cell measurement equipment that is realized in the form of a plurality of BMS slaves 31 and 32 corresponding to a plurality (N) of battery modules 10. Each lane of BMS slaves is connected to a respective BMS master (21 in Lane 1 and 22 in Lane 2). The connection is preferably established by means of a digital bus system. While BMS master 21 of Lane 1 comprises dedicated means for battery state prediction on the basis of pre-defined flight profile 51, in the illustrated embodiment, BMS master 22 of Lane 2 does not include respective equipment, but is connected to Flight Management System (FMS) 42 for the respective evaluation according to the planned flight profile 52. In the first lane, BMS master 21 is connected to the indication and recording system 61 of Lane 1 for forwarding the predicted battery state information. In the second lane, FMS 42 is connected to the indication and recording system 62 of Lane 2 for forwarding the predicted battery state information. On this basis, each of the indication and recording systems 61 and 62 generates respective indications to the pilot 70. Hence, it is the pilot who analyses and evaluates the respective prediction results from the individual lanes.

More specifically, the ESS shown on the left-hand side comprises plural battery modules 10 (in the illustrated case: N battery modules, N being a natural number larger than 1, out of which only three labeled "1," "2," and "N," respectively, are shown explicitly). Each of the battery modules is further subdivided in a plurality of battery cells (not shown). In the illustrated embodiment, the battery management system is implemented as a master-slave architecture. Battery management system slaves (BMS slaves 31 and 32) are responsible for collecting the actual measurement results per a single or a plurality of battery cells included in a battery module each. The actual battery cell measurements are implemented by respective measurement devices (sensors), including but not limited to voltmeters, ampere meters and temperature detectors. The measurement results collected by the BMS slaves 31 and 32 are then forwarded to a respective battery management system master (BMS masters 21 and 22). The BMS master (21 or 22) aggregates the battery measurement data of the individual cells received from the BMS slaves (31 or 32). The BMS master (21 or 22) is further responsible for calculating the respective battery states and health parameters on the basis of the measurement data (Battery State and Health Parameter Observation). In addition, the BMS master (21 or 22) may perform a low-level fundamental safety check up so as to identify erroneous measurements, for example, by detecting out of range or stuck values. In the illustrated example, per each lane (Lane 1 in the upper portion and Lane 2 in the lower portion of the drawing) there are illustrated three BMS slaves (one per battery module) and one BMS master. However, the present disclosure is by no means limited to the illustrated exemplary number of elements. In the illustration of FIG. 2, reference numerals ending with "1" (21, 31, 51, 61) refer to elements of Lane 1 and reference numerals ending with "2" (22, 32, 42, 52, 62) refer to elements of Lane 2.

In case of detected erroneous measurement data, these values will be invalidated by a dedicated qualifier (i.e., bit indicating invalidity accompanying a value that has been detected as erroneous).

The two independent BMS masters 21 and 22 each calculate the battery cell state and health parameters with two dissimilar algorithms, respectively. Examples for battery cell states are the cell state of charge, cell core temperature or cell tab temperature. Examples for health parameters of battery cells are the cell capacity and the cell impedance. Full independence is provided, because BMS master 21 observes the battery cell state and health only based on BMS Lane 1 measurements and BMS master 22 observes the battery cell state and health only based on BMS Lane 2 measurements.

As indicated above, the structure of FIG. 2 is illustrative for embodiments only and the disclosure is not limited to these. In particular, the battery state prediction equipment of both lanes can be implemented with dedicated hardware of the battery management system, in units including the battery state and health parameter equipment (BMS master units). In that case, the structure of the second lane BMS master unit may be similar to that of the first lane BMS master unit 21 of FIG. 2, with the difference that the planned flight profile is provided from the outside (FMS/VMC) instead of locally storing the pre-defined flight profile (not shown in the drawings). Alternatively, the battery state prediction equipment of both lanes may be FMS implemented. The structure of the first lane may then be similar to that of the second lane of FIG. 2, with the difference that in the first lane a pre-defined flight profile (fixed for the air vehicle) must be stored (not shown in the drawings). Examples of algorithms for battery cell state and health observation for being used by one and only one of the independent lanes, respectively, include but are not limited to:

- a model-based state-of-charge (SOC) estimation algorithm (for the cell state),
- a model-based cell parameter estimation algorithm (for the health of a battery cell),
- an algorithm using Electrochemical Impedance Spectroscopy (EIS),
- a Coulomb Counting algorithm (for the cell state), and
- an empirical ageing model, a dedicated maintenance procedure and/or dedicated charging procedure (for the health).

Specifically, EIS is based on an active excitation of all individual cells with sinusoidal current and measurement of the voltage response of each cell. The ratio between output and input signal allows the computation of a complex system impedance. The excitation is made with sinusoidal current of different frequencies. Hence, a frequency dependent voltage response can be obtained. This allows for determination of a frequency dependent system impedance (system impedance spectrum). The system impedance spectrum allows for the calculation of the cell impedance for each individual cell battery as a basic health parameter. Furthermore, the frequency dependent system impedance allows for the calculation of the SOC for each individual cell. Input to that function is the excitation current of the EIS and the response voltage of each individual cell measurement by the battery cell measurement equipment of a lane employing EIS.

On the other hand, the Coulomb Counting algorithm is based on considering the balance between charging and load currents. More specifically, input to the Coulomb counting is the charging current for each individual cell during ground operation, i.e., when the ESS is charged. During flight, input to the Coulomb counting are the load currents of each individual cell. Hence, during flight, the Coulomb counting algorithm calculates the battery SOC based on all load currents for each individual cell. Output of the Coulomb counting is an estimation of the SOC for each individual cell.

Empirical ageing models are known in the art and may estimate the battery health based on the observed utilization (for example: charge throughput in ampere hours (Ah), mean temperature, depth of discharge and others). Input to this algorithm is the current, voltage and temperature for each individual cell measured by the battery cell measurement equipment of a lane employing empirical ageing models. The empirical ageing model can be supported by dedicated maintenance procedures. Battery health parameters are determined by representative charging procedures or pulse power profiles. Output is the health parameter for each individual cell.

Model-based estimation algorithms are well known to a skilled person and a detailed description thereof will not, therefore, be included herein. They are used for estimating system variables of state that are not directly measurable, such as state-of-charge of a cell, cell impedance or cell capacity. The approach of model-based algorithms is generally based on a comparison of measurable output variable values of a system having known input variable values with the output of a model of a system for the same input values, wherein at least one model parameter characterizing a variable of state to be estimated is regularly updated on the basis of a difference between the measured system output and the model output, as a feedback.

Model-based estimation algorithms include, for instance, those using dual Kalman filters. As input, the current, voltage and temperature for each individual cell measured by the battery cell measurement equipment of a lane employing model-based estimation is used. Estimated system variables are, for example, the SOC and health parameters for each individual cell.

As indicated, possible algorithms to be employed by any of the redundant independent lanes are not limited to the above examples but other algorithms a skilled person is aware of are equally applicable. This includes algorithms operating with the use of neural networks.

In the following, details of state observation and prediction as performed by the individual lanes of Lane 1 and Lane 2 and the respective indications of the pilot will be explained with reference to FIGS. 3A and 3B. Generally, these figures are similar to the general drawing of FIG. 1 in that in the upper portion the power demand in the individual phases according to the chosen flight profile is shown for the past flight phase (left) and the future flight phase to be predicted according to the flight profile (right). In the lower portion of the drawings, a battery state observed/predicted and indicated to the pilot is respectively shown schematically and by way of example only.

Figure 3A:
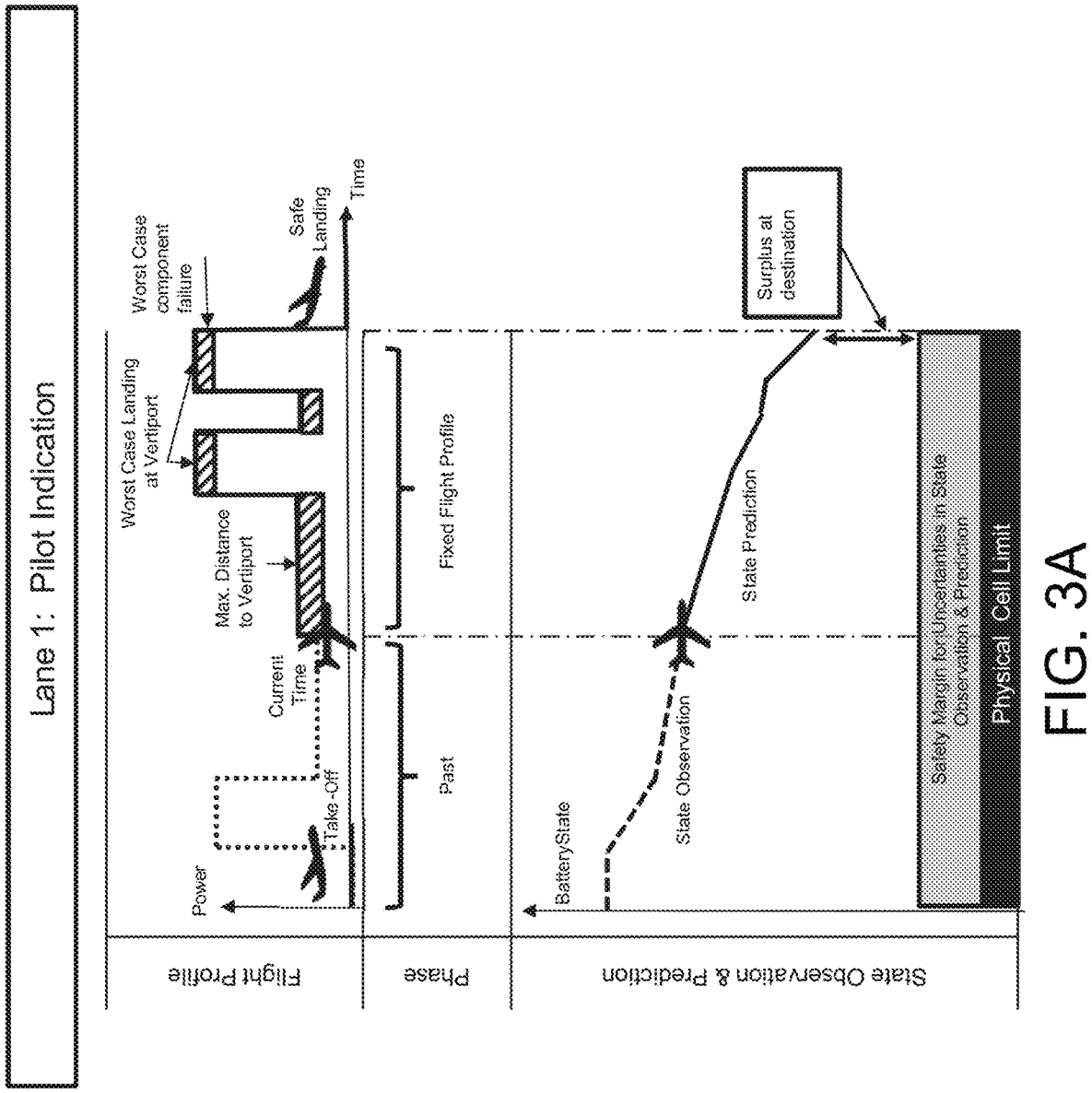
FIG. 3A is a diagram illustrating state observation and state prediction as well as the indication provided to the pilot on the basis of the prediction according to a fixed flight profile by the first lane.

FIG. 3A illustrates the calculation and a schematic representation of the output to the pilot for Lane 1.

In this case, battery state prediction is based on a fixed (pre-defined) flight profile. At any given ("current") point of time during the flight, the fixed flight profile indicates the power requirement under the worst-case conditions (maximum distance to closest airfield for landing, worst-case environmental conditions including worst-case landing conditions at the closest airfield and worst-case component failure). The prediction has to take into account that there must be a surplus (remaining accessible energy) at the time of landing, which is indicated by the vertical double arrow in this drawing (i.e., corresponding to the hatched portion on the right-hand side of FIG. 1). In addition, below the surplus, the safety margin of the battery state, i.e., the difference between the end point condition and the physical (cell) limit is illustrated as a bar below the graph indicating the battery state over time.

In other words, in Lane 1 battery state prediction based on the fixed flight profile predicts whether there are sufficient accessible energy for safely landing at any (arbitrary) current point in time during the flight. Depending on flight progress, this means landing at an alternative destination (alternate landing point) or the planned destination. Hence, the "destination" for which the surplus is indicated means, in particular, an alternative destination.

Figure 3B:
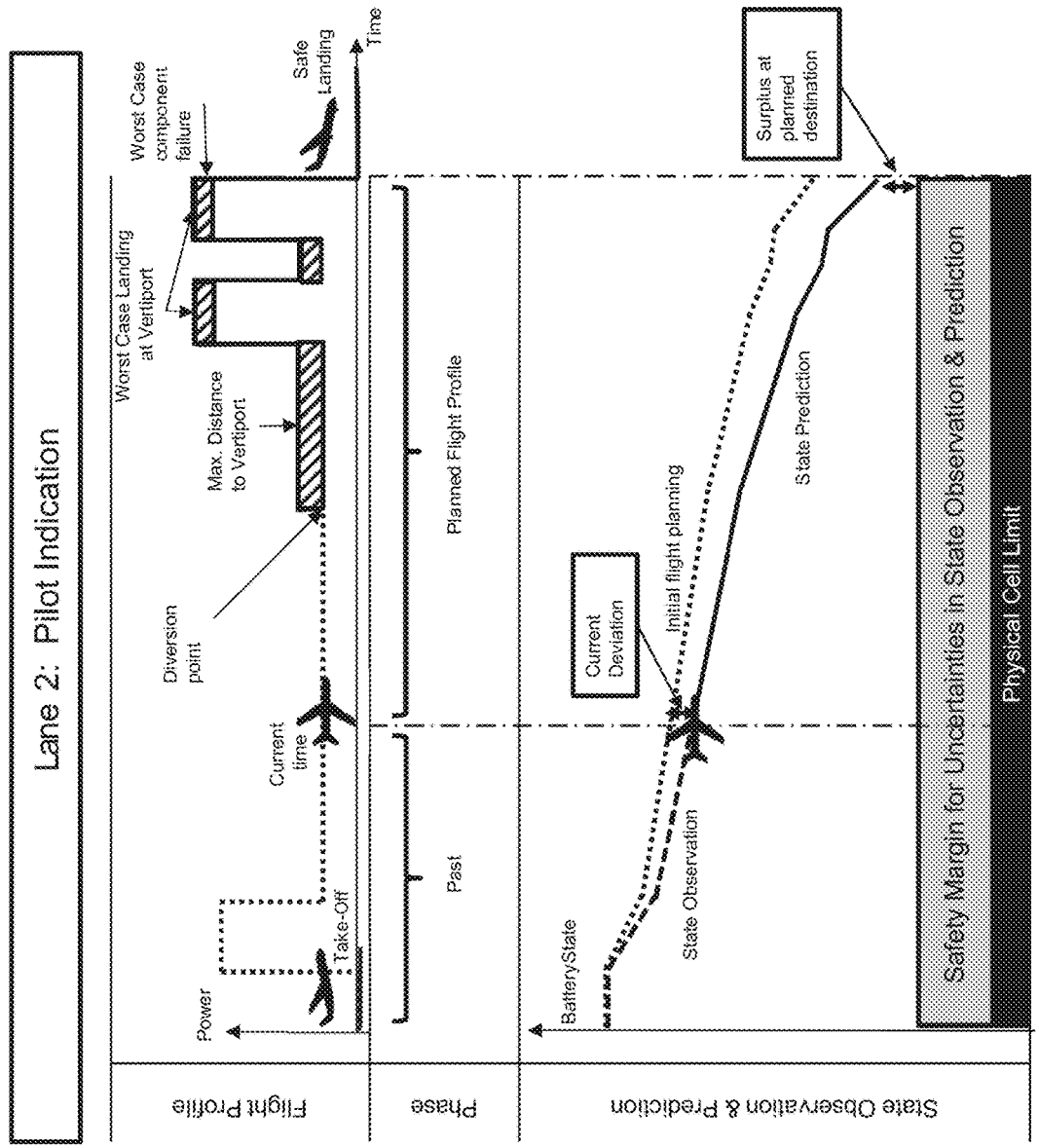
FIG. 3B is a diagram illustrating state observation and state prediction as well as the indication provided to the pilot on the basis of the prediction according to the planned flight profile by the second lane.

FIG. 3B illustrates the calculation and a schematic representation of the output to the pilot for Lane 2.

The difference between FIG. 3B and FIG. 3A is that in Lane 2 (FIG. 3B), an actual planned flight profile is taken as the basis, instead of the pre-defined (fixed) flight profile. Here, the worst-case conditions are assumed to apply, not from the current point in time, but only from a certain point in time in the future, the so-called diversion point (Last Point of Diversion). This is, the last point en route that the aircraft can fly and then divert to another airfield for landing with safe accessible energy. In other words, the fixed flight profile is always appended at the end of the planned flight profile, starting at the deviation point.

In addition to the observed battery state (dashed line on the left-hand side) and state prediction according to the planned flight profile (through line on the right-hand side), the battery state in accordance with the initial flight planning is additionally shown (dotted line). The difference between both curves at the current point of time is indicated as the "current deviation."

On the one hand, and as explained above with reference to FIG. 1, there must still be some remaining accessible energy (for example: 5%) at the point of destination, for safety reasons ("End Point Condition"). This is the "Surplus at planned destination" as indicated by the double arrow on the right-hand side of the drawing. On the other hand, the minimum predicted battery state at the destination (including the surplus) must still exceed the physical limit by a certain amount, which is the illustrated "Safety Margin for Uncertainties in State Observation & Prediction." This is necessary to take into account the maximum possible error in prediction ("worst-case overestimation"). Hence, if the predicted state at the destination exceeds the physical cell limit by both the safety margin and the surplus, even in case of the predicted energy being maximally overestimated, the physical limit is not reached.

Thus, while Lane 2 predicts the battery state for safe landing according to the planned flight profile, the prediction by Lane 1 predicts the battery state for a worst-case scenario. The prediction by Lane 1 indicates, at any point in time, whether there is sufficient accessible energy left for safe landing at the closest airfield. The prediction by Lane 2 indicates whether there is sufficient accessible energy left for safe landing at the planned destination, including the case of safely diverting to a closest airfield at a later point (diversion point) in time. Since the necessary energy for traveling according to the planned flight profile are generally higher than those for traveling according to the fixed flight profile (i.e., immediately diverting to the closest airfield), a prediction of sufficient battery state for traveling according to the planned flight profile by Lane 2 always includes sufficiency of battery state for traveling according to the fixed flight profile. Hence, the two lanes provide for full redundancy regarding a prediction of safe landing with maximum distance to the closest airfield (vertiport for eVTOL).

For Lane 1, a visual or aural alert can be indicated to the pilot when the surplus of the respective battery state is not sufficient to reach a closest (alternate) landing point in case of a worst-case component failure. This alert can be assumed as "low-energy alert."

For Lane 2, the complete battery state evolution against the planned flight profile is indicated and allows various different means of graphical or aural indication to the pilot.

As indicated by the designation "Indication & Recording System," the system is further capable of recording at least the information indicated to the pilot, but the recording capabilities are not limited to those and may include recording further information obtained by the battery management system.

The configuration of the Battery Management System according to the present disclosure may allow for certification in accordance with EUROCAE ED-289 GUIDANCE DETERMINATION OF ACCESSIBLE ENERGY IN BATTERY SYSTEMS FOR EVTOL APPLICATIONS, https://eshop.eurocae.net/eurocae-documents-and-reports/ed-289/.

The present disclosure is defined by the appended claims and is not limited to the particulars of the embodiments of the above detailed description.

In summary, the present disclosure relates to a battery management system for an electric air vehicle such as an eVTOL aircraft for observing a battery system state and a battery health state of an energy storage system of the air vehicle. Based on an observation result, a state prediction, in particular, a prediction of the remaining accessible energy, is carried out during a flight. In particular, the observation and prediction is performed by two independent and dissimilar lanes of the battery management system. A first lane predicts the battery state according to a pre-defined flight profile representing a worst-case scenario. A second lane predicts the battery state according to a planned flight profile so as to determine a range of the flight. Hence, it can be confirmed during the flight that the intended destination can be safely reached with the remaining accessible energy. Otherwise, an alert to an operator is issued to immediately deviate to the closest alternate airfield for landing. Thus, full redundancy of prediction, excluding a single point of failure leading to a catastrophic event, is achieved.

What is claimed is:

1. A battery management system for an electric air vehicle, the battery management system being adapted for battery cell state monitoring, health parameter monitoring and battery state prediction of a battery system forming an energy storage system of the electric air vehicle, the battery management system comprising:
    two independent and dissimilar lanes for battery cell state and health parameter determination and the battery state prediction, each of the two independent and dissimilar lanes including:
        battery cell measurement equipment for obtaining battery cell measurement data of each of a plurality of battery cells constituting the battery system; and
        battery state and battery health parameter determination equipment adapted to calculate a battery cell state and at least one health parameter based on the battery cell measurement data obtained by the battery cell measurement equipment of a respective lane by using dissimilar algorithms, respectively, the battery management system further comprising:
            first lane battery state prediction equipment being adapted to perform a battery state prediction predicting a battery cell state evolution with regard to a pre-defined flight profile that is pre-stored and fixed for the electric air vehicle; and
            second lane battery state prediction equipment being adapted to perform a battery state prediction predicting a battery cell state evolution with regard to a planned flight profile of a currently planned flight.

2. The battery management system according to claim 1, wherein the battery cell state includes at least one of a cell state of charge, a cell core temperature or a cell tab temperature.

3. The battery management system according to claim 1, wherein the battery cell measurement data obtained by the battery cell measurement equipment includes at least one of: cell terminal voltage, current or surface temperature.

4. The battery management system according to claim 1, wherein, in each of the two independent and dissimilar lanes, the battery cell measurement equipment and the battery state and battery health parameter determination equipment are arranged in a master-slave architecture, wherein a battery measurement master unit aggregates the battery cell measurement data obtained by a plurality of battery measurement slave units and includes the battery state and battery health parameter determination equipment of the respective lane.

5. The battery management system according to claim 1, wherein health parameters include at least one of: cell capacity or cell impedance.

6. The battery management system according to claim 1, wherein battery cell measurements performed by the battery cell measurement equipment of each of the two independent and dissimilar lanes are dissimilar to each other.

7. The battery management system according to claim 1, wherein each lane comprises an indication and recording system adapted to receive battery state data predicted by the respective lane.

8. The battery management system according to claim 7, wherein the indication and recording system of the first lane battery state prediction equipment is configured to indicate an alert to a pilot when a remaining accessible energy according to the predicted battery state is insufficient to reach a landing point at least partially based on one or more of: a worst-case component failure, a worst-case environmental weather conditions, or a worst-case aircraft performance.

9. The battery management system according to claim 7, wherein the indication and recording system of the second lane battery state prediction equipment is adapted to indicate the battery cell state evolution against the planned flight profile to a pilot.

10. The battery management system according to claim 7, wherein the indication and recording system of each lane are configured to indicate the battery cell state evolution to a pilot graphically.

11. The battery management system according to claim 1, wherein the battery management system is adapted to determine an overall battery state or health assessment at least partially based on the battery cell measurement data obtained by the battery cell measurement equipment for a battery cell with a minimum value of a battery cell state and health parameter.

12. The battery management system according to claim 1, wherein the battery cell state is calculated by the two independent and dissimilar lanes based on two out of:
- a model-based state-of-charge (SOC) estimation algorithm;
- an algorithm using Electrochemical Impedance Spectroscopy (EIS); and
- a Coulomb Counting algorithm, wherein
  - each of the two independent and dissimilar lanes uses a different one out of the above algorithms;
  - in a lane using the model-based SOC estimation algorithm, the battery cell measurement equipment is adapted to measure a current, a voltage and a temperature of each of the plurality of battery cells;
  - in a lane using the EIS, the battery cell measurement equipment is adapted to individually excite the plurality of battery cells with sinusoidal current of variable frequency and to measure a voltage response of each cell, and a vehicle management computer is adapted to calculate a complex system impedance based on a ratio between an input excitation current and the voltage response; and
  - in a lane using the Coulomb Counting algorithm, the battery cell measurement equipment is adapted to determine a charging current for each individual cell of the plurality of battery cells during ground operation and to determine overall load currents of each individual cell and the vehicle management computer is adapted to calculate a state-of charge based on the determined charging current and overall load currents of each individual cell.

13. The battery management system according to claim 1, wherein the at least one health parameter is calculated by the two independent and dissimilar lanes based on two out of:
- a model-based cell parameter estimation algorithm;
- an algorithm using Electrochemical Impedance Spectroscopy (EIS);
- a dedicated maintenance procedure and/or a dedicated charging procedure; and
- an empirical ageing model, wherein
  - each of the two independent and dissimilar lanes uses a different one out of the above algorithms;
  - in a lane using the model-based cell parameter estimation algorithm, the dedicated maintenance procedure and/or the dedicated charging procedure or the empirical ageing model, the battery cell measurement equipment is adapted to measure a current, a voltage and a temperature of each of the plurality of battery cells; and
  - in a lane using the EIS, the battery cell measurement equipment is adapted to individually excite the plurality of battery cells with sinusoidal current of variable frequency and to measure a voltage response of each cell, and a vehicle management computer is adapted to calculate a complex system impedance based on a ratio between an input excitation current and the voltage response.

14. The battery management system according to claim 1, wherein the first lane battery state prediction equipment is integrated in a unit of a first lane comprising the battery state and battery health parameter determination equipment of the first lane.

15. The battery management system according to claim 14, wherein an arrangement of the first lane, the battery cell measurement equipment and the battery state and battery health parameter determination equipment is a master-slave architecture, and the unit of the first lane is a battery management master unit of the first lane.

16. The battery management system according to claim 1, wherein the second lane battery state prediction equipment is realized by a flight management system implemented by a partition of a vehicle management computer provided outside of and separately from the battery system forming the energy storage system.

17. The battery management system according to claim 1, wherein the second lane battery state prediction equipment is integrated in a unit of a second lane comprising the battery state and battery health parameter determination equipment of the second lane.

18. The battery management system according to claim 17, wherein an arrangement of the second lane, the battery cell measurement equipment and the battery state and battery health parameter determination equipment is a master-slave architecture, and the unit of the second lane is a battery management master unit of the second lane.

19. The battery management system according to claim 1, wherein both the first lane battery state prediction equipment and the second lane battery state prediction equipment are realized by a flight management system implemented by respective partitions of different and independent vehicle management computers provided outside of and separately from the battery system forming the energy storage system.

20. An air vehicle comprising a battery management system for an electric air vehicle, the battery management system being adapted for battery cell state monitoring, health parameter monitoring and battery state prediction of a battery system forming an energy storage system of the electric air vehicle, the battery management system comprising:
two independent and dissimilar lanes for battery cell state and health parameter determination and the battery state prediction, each of the two independent and dissimilar lanes including:
battery cell measurement equipment for obtaining battery cell measurement data of each of a plurality of battery cells constituting the battery system; and
battery state and battery health parameter determination equipment adapted to calculate a battery cell state and at least one health parameter based on the battery cell measurement data obtained by the battery cell measurement equipment of a respective lane by using dissimilar algorithms, respectively, the battery management system further comprising:
first lane battery state prediction equipment being adapted to perform a battery state prediction predicting a battery cell state evolution with regard to a pre-defined flight profile that is pre-stored and fixed for the electric air vehicle; and second lane battery state prediction equipment being adapted to perform a battery state prediction predicting a battery cell state evolution with regard to a planned flight profile of a currently planned flight.

21. The air vehicle according to claim 20, wherein the air vehicle is an electric vertical take-off and landing aircraft.

* * * * *